United States Patent [19]
Habegger

[11] Patent Number: 5,552,965
[45] Date of Patent: Sep. 3, 1996

[54] CONTROL APPARATUS HAVING A COMPACT AND ACCESSIBLE ARRANGEMENT OF PRINTED CIRCUIT BOARDS

[75] Inventor: Peter Habegger, Murten, Switzerland

[73] Assignee: SAIA AG, Switzerland

[21] Appl. No.: 222,582

[22] Filed: Apr. 4, 1994

[30] Foreign Application Priority Data

Apr. 2, 1993 [EP] European Pat. Off. ............. 93810235

[51] Int. Cl.⁶ ................ H05K 7/14; H05K 9/00
[52] U.S. Cl. .............. 361/801; 361/752; 361/736; 361/741; 361/790; 361/800; 174/35 R; 174/35 GC; 174/51
[58] Field of Search ...................... 361/683, 685, 361/686, 728, 730, 736, 741, 756, 785, 796, 790, 753, 799, 800, 818, 684, 724, 725, 727, 801, 752; 174/35 R, 35 GC, 51

[56] References Cited

U.S. PATENT DOCUMENTS

| | | | |
|---|---|---|---|
| 3,684,925 | 8/1972 | Naff, Jr. | 361/688 |
| 3,736,471 | 5/1973 | Donze et al. | 361/790 |
| 4,065,200 | 12/1977 | D'Angelo | 439/61 |
| 4,850,657 | 7/1989 | Placke et al. | 361/686 |
| 4,894,792 | 1/1990 | Mitchell et al. | 361/686 |
| 4,926,291 | 5/1990 | Sarraf | 361/818 |
| 5,038,308 | 8/1991 | Le et al. | 361/686 |
| 5,051,868 | 9/1991 | Leverault et al. | 361/686 |
| 5,087,932 | 2/1992 | Chikano | 361/818 |
| 5,121,295 | 6/1992 | Lam | 361/686 |
| 5,126,954 | 6/1992 | Morita | 361/686 |
| 5,138,525 | 8/1992 | Rodriguez | 361/686 |
| 5,162,980 | 11/1992 | Morgan et al. | 361/818 |
| 5,214,570 | 5/1993 | Shah et al. | 361/785 |
| 5,227,957 | 7/1993 | Deters | 361/730 |
| 5,289,342 | 2/1994 | Spalding et al. | 361/736 |
| 5,299,089 | 3/1994 | Lwee | 361/685 |
| 5,305,182 | 4/1994 | Chen | 361/684 |
| 5,388,030 | 2/1995 | Gasser et al. | 361/753 |
| 5,398,156 | 3/1995 | Steffes et al. | 361/753 |

FOREIGN PATENT DOCUMENTS

| | | | |
|---|---|---|---|
| 0207496 | 1/1987 | European Pat. Off. | 361/753 |
| 0476322 | 3/1992 | European Pat. Off. | |
| 0482418 | 4/1992 | European Pat. Off. | 361/796 |
| 3402644 | 8/1985 | Germany | 361/683 |

*Primary Examiner*—Donald A. Sparks
*Attorney, Agent, or Firm*—Ostrolenk, Faber, Gerb & Soffen, LLP

[57] ABSTRACT

A housing for a control apparatus is made of a synthetic material and includes a lower part and a cover. In the lower part are provided an upper printed board and one or more lower printed boards. Additional modules can be connected with the upper printed board by means of connectors. The lower printed boards are inserted on supporting ribs and between guiding ribs under the upper printed board and in the inserted condition they are exchangeably connected with a printed bus. At the bottom of the lower part of the housing is fastened a screening sheet. The housing of the apparatus can be realized at low costs and due to the screening sheet, a sufficient screening can be guaranteed. The two or three stages permit a compact construction of the apparatus and notwithstanding, all printed boards are easily accessible, in that the lower printed boards are to be removed without any dismounting of the upper printed board. The construction of the apparatus and of the printed boards permit different kinds of insertions of the apparatus as well as a simple exchange of the printed boards and thus versatile possibilities of designs.

12 Claims, 2 Drawing Sheets

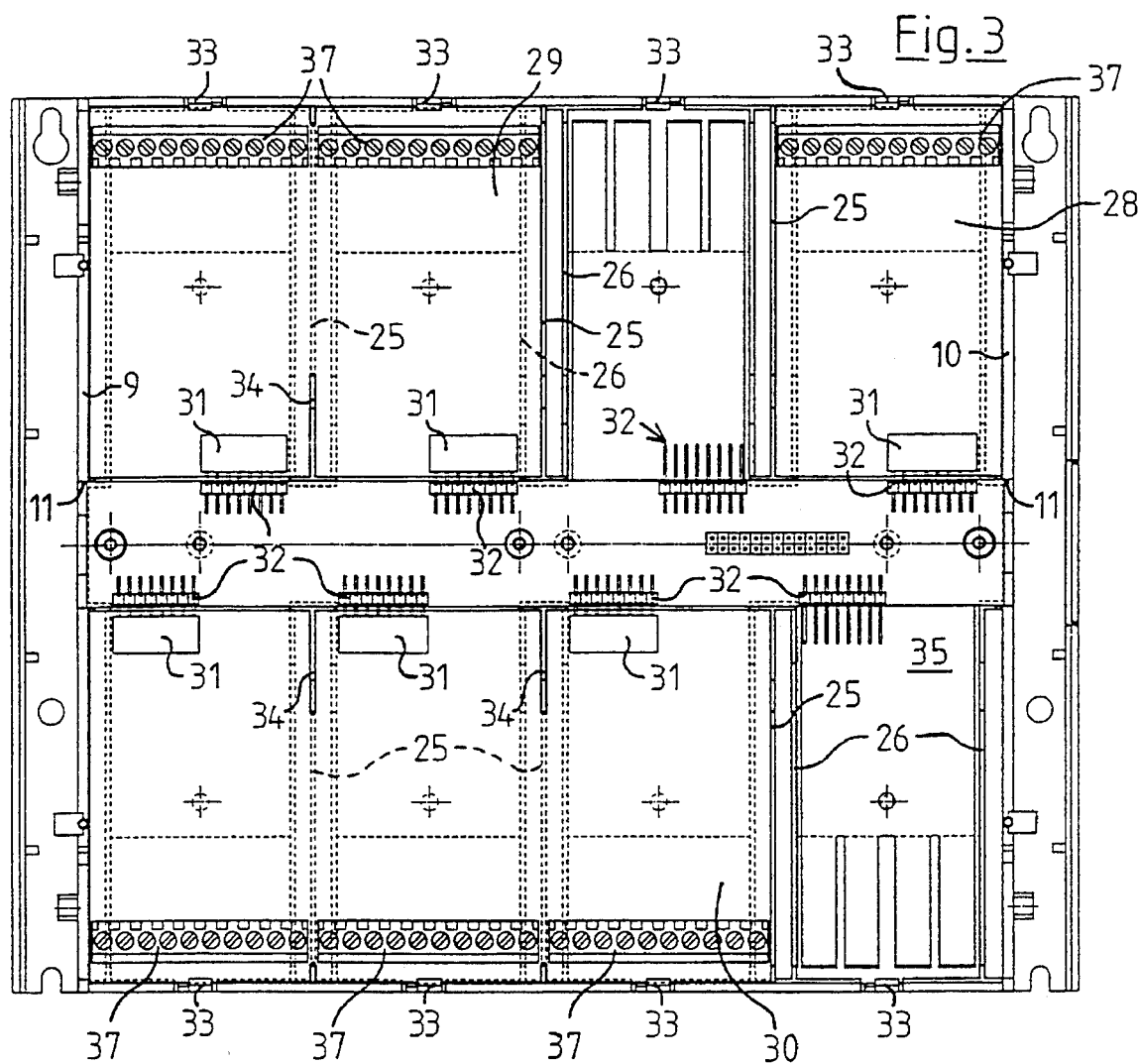

CONTROL APPARATUS HAVING A COMPACT AND ACCESSIBLE ARRANGEMENT OF PRINTED CIRCUIT BOARDS

BACKGROUND OF THE INVENTION

The present invention relates to a programmable control apparatus with printed circuit boards contained in a housing. Such control apparatuses serve to the programmed control of machine tools and installations, production processes and similar. Known control apparatuses of this kind comprise metal housings in which the printed circuit boards are fixedly contained. An exchange of these printed circuit boards is not possible. Metal housings provide for a good screening against parasitics fields but they are expensive to produce. For the rest, the accessibility of the printed boards by known apparatuses is unsatisfactory, that is, it requires numerous mounting and dismounting operations in order to exchange or replace certain printed boards and the possibilities of mounting printed boards of different kinds is limited. An optimal utilization of the space and thus a compact arrangement of printed circuit boards is not found in known control apparatuses.

SUMMARY OF THE INVENTION

It is an object of the present invention to realize a control apparatus of advantageous price, compact construction, in which, in spite of the compact construction, all pieces are easily accessible. At the same time, one tends to a versatile expandability with different kinds of printed boards. This problem is solved according to the present invention, in that a housing of synthetic material with bottom part and cover is foreseen, printed boards being accessibly arranged in the bottom part in at least two planes, one above the other.

The present invention includes printed circuit boards in the housing and in at least a first plane and a second plane wherein the second plane is positioned above the first plane. A bus strip at the first plane is carried on a base of the housing. The bus strip has connecting plugs on both sides thereof so that printed circuit boards are attachable to both sides of the bus strip at the first plane.

Guides are preferable in the bottom part of the housing, along which printed boards are slidingly arranged and plugged in the direction of their plug connections. This permits the lower printed boards to be very easily built in or removed, in that they are pushed like a drawer under one or more upper printed boards and in that they can be connected with a printed bus. Good accessibility of the upper printed board or boards is also present. One can push printed boards of different dimensions into the guides or a full printed board can also be mounted on the guides. In spite of the utilization of a simple housing of synthetic material, of advantageous price, one can realize a sufficient screening, more particularly of the printed boards at the bottom. These printed circuit boards at the bottom of the housing are preferably peripheric modules with a screening sheet at the housing bottom which is in contact by elastic fingers with at least one printed board, so that it is held at the desired potential, in order to provide for an effective screening.

Further advantages and features of the present invention are set forth in the dependent claims and in the following description of an example of the present invention.

SHORT DESCRIPTION OF THE DRAWINGS

FIG. 2 shows a cross-sectional view along the line II—II of FIG. 1 with the cover lifted and FIG. 3 shows a plan view of the apparatus with the cover and the upper printed board removed.

DETAILED DESCRIPTION OF THE INVENTION

Figure 2:
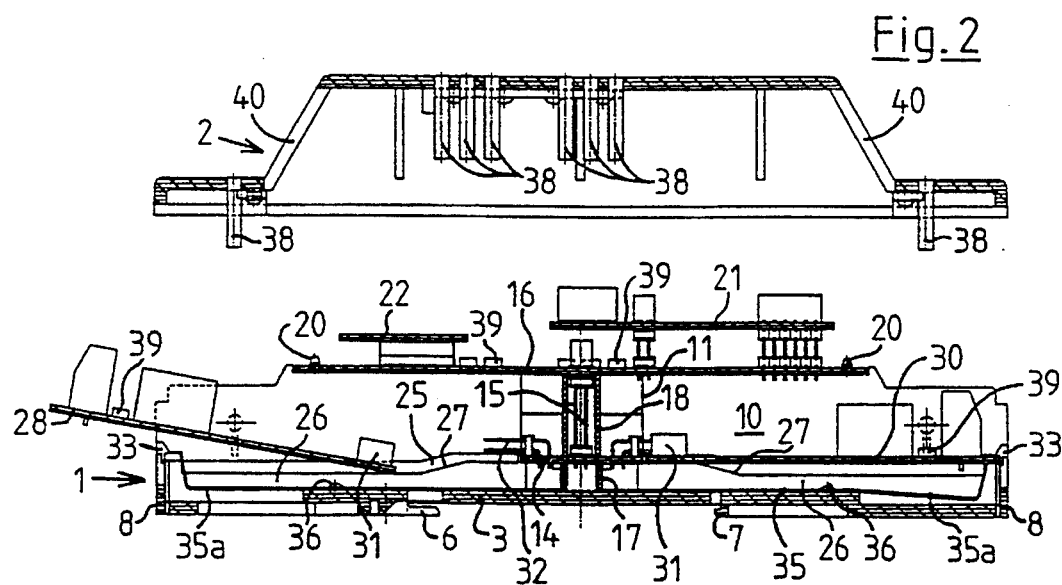

The illustrated apparatus comprises a housing of synthetic material with a lower part 1 and a cover 2. The cover can be held on the lower part by snap action (not illustrated) or by other appropriate means, for example by screw fasteners. The bottom 3 of the lower part 1 is provided with holes 4 and recesses 5 for mounting on a flat base, as well as with hooks 6 and 7 for mounting on a standard rail. Two opposite lateral walls 8, shown in cross section in FIG. 2, are relatively low so that the housing remains open and accessible at these two opposite sides also when the cover is set in place. At both other opposite sides are provided relatively high lateral walls 9 and 10 which are provided in the middle with a gap 11 for access of cables. The lateral walls 9 and 10 form together with a slightly lower outer wall 12 a lateral channel for cables. Through these channels for cables, the latter can be guided to connecting terminals or guided inside of the lateral walls 9 and 10.

A printed bus in the form of a strip 14 is arranged in the middle of the lower part of the housing, between the gaps 11 of the side walls 9 and 10. This printed bus is connected by pins 15 to an upper printed board 16. By means of distance sleeves 17 and 18, one of both and the printed boards 30 and 16 is traversed by fastening screws fastened to an eye of the bottom 3, the printed boards 30 and 16 being connected in the right position together and with the housing. The upper printed board 16 comprises at all four edges holes 19 in which screws 20 of the side walls 9 and 10 engage for orienting the printed board 16.

Figure 1:
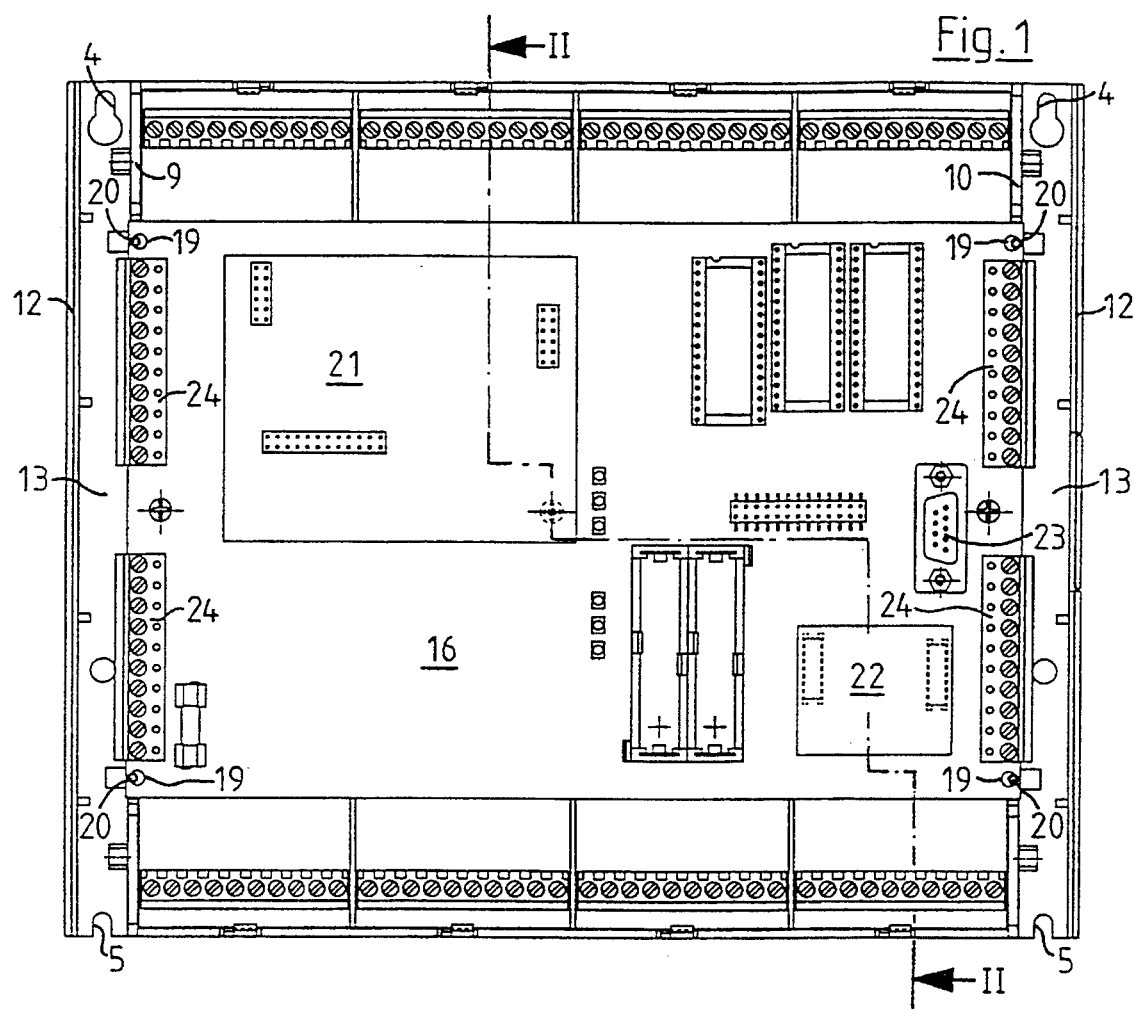
FIG. 1 shows a plan view of the apparatus with the cover removed.

Additional modules, e.g. a display module 21 or a module 22 as serial interface can be inserted on the upper printed board. A programming apparatus can be connected with connector 23 of the upper printed board 16. In the cover 2, openings or windows can be provided, through which a connector for the programming apparatus can be guided or a display unit of the module 21 is viewable. The upper printed board 16 which is provided with further electronic components which are partly schematically indicated in FIG. 1, is normally executed as a main printed circuit board with the central unit CPU of the processor. This main printed circuit board is provided with lateral terminal strips 24 with which cables guided through the channels 13 can be connected.

Guides are provided at the bottom of the lower part 1 of the housing for printed boards to be inserted. These guides consist on the one hand of somewhat higher separating ribs 25 (FIGS. 2 and 3) which separate each of four insertion chambers on each side against each other and two somewhat lower supporting ribs 26 which lie inside of adjacent separating ribs 25. The outermost external guiding chambers are limited on one side by the side walls 9 and 10 respectively. The supporting ribs 26 comprise an inclined ramp 27 interconnecting an internal higher part with an external part of smaller height of the supporting rib 26. In the guiding chambers, lower printed boards or modules (28, 29 or 30) can be inserted from the outside under the upper printed board 16.

FIG. 2 shows on the left side how one of these printed boards is inserted. Each printed board comprises at the internal edge a connecting plug 31 which can be connected to a corresponding connector 32 of the printed bus 14. At the time of insertion of a printed board 28, the front edge of the printed board maintained somewhat inclined is guided vertically by the supporting ribs 26 and the printed board is guided practically without clearance lateraly between the separating ribs 25. At the time of insertion of the printed board, the connecting plug 31 is thus securely connected in the right position with the connector 32. Printed board 28 is pressed under a catch 33 as shown in FIG. 2, at the left, like that of the inserted printed board 30. It is thus possible to have an extremely simple insertion and exchange of the lower printed boards. That is these printed boards are easily accessible for mounting or replacing during manufacture or anytime thereafter. The lower printed boards 28, 29 and 30 are provided with strips of terminals 37 with which cables can be connected.

As shown in FIG. 3, printed boards and modules of various kinds can be utilized. The printed board 28 has a width which corresponds to one guiding chamber, the module 29 has a width of two guiding chambers and the module 30 has a width which extends over three guiding chambers. The printed boards 29 and 30 have slits 34 in which the raised internal parts of the separating ribs 25 can engage. It is thus provided not only the mentioned easy accessibility to all printed boards in spite of the compact arrangement, over two or three stages, but it is also possible to insert in one and the same housing printed boards of different dimensions and thus to positively respond to different requests.

At the bottom of the lower housing part is fixed a screening sheet 35 by means of thermally deformable fastening bolts 36. As illustrated in two places in FIG. 3, the screening sheet 35 comprises in each guiding chamber four elastic deformable tongues 35*a* which lie tightly with their external edges to an unillustrated contact of the lower printed board. This provides for a reliable connection betweeen the printed boards and the screening sheet 35.

In the cover 2 of the housing are inserted optical fibres 38 which lie, when the cover is assembled, with their lower front side immediately over the light emitting diodes 39. Some light emitting diodes are indicated on the upper printed board 16 and on the lower printed boards in FIG. 2.

The cover of the housing is formed according to the construction of the electronic components of the apparatus and in fact with two flat external edge parts and a raised central part. Between these two parts are inclined connecting walls with ventilation slits 40 are present. This provides for a good ventilation and cooling of the apparatus. Both housing parts are of a simple construction of synthetic material which can be produced without expensive tools.

Although the present invention has been described in relation to a particular embodiment thereof, many other variations and modifications and other uses will become apparent to those skilled in the art. It is preferred, therefore, that the present invention be limited not by the specific disclosure herein, but only by the appended claims.

I claim:

1. A programmable control apparatus, comprising:

a housing of a synthetic material including a base and a cover positionable on said base;

printed circuit boards housed in said housing in at least a first plane and a second plane positioned above said first plane, a plurality of printed circuit boards adapted to be positioned in said first plane, and at least one printed circuit board fixed in said second plane;

a bus strip at said first plane and carried on said base, and said bus strip having connecting plugs on both sides thereof;

said plurality of printed circuit boards in said first plane are attachable to said connecting plugs on both sides of said bus strip and thereby positionable in said first plane; and guides provided on said base and cooperating with said printed circuit boards for guiding said printed circuit boards of said first plane into contact with said connecting plugs of said bus strip.

2. The apparatus according to claim 1, wherein there are three printed circuit boards attached to said connecting plugs in said first plane.

3. The apparatus according to claim 2, further comprising a screening sheet on said base having tongues extending therefrom which are in electrical contact with said printed circuit boards in said first plane.

4. The apparatus according to claim 1 wherein said base includes oppositely disposed walls which are lateral channels for receiving cables in said housing.

5. The apparatus according to claim 4 wherein said oppositely disposed walls are supports for a printed circuit board in said second plane.

6. The apparatus according to claim 1 wherein a printed circuit board in said second plane includes a central processing unit which is a main printed circuit board, and said printed circuit boards in said first plane are peripheral modules.

7. The apparatus according to claim 1 wherein a printed circuit board is attachable to a printed circuit board in said second plane and thereby is in a third plane.

8. The apparatus according to claim 7 wherein said printed circuit board in said third plane is a display module.

9. The apparatus according to claim 7 wherein said printed circuit board in said third plane is a serial interface module.

10. The apparatus according to claim 7 wherein said printed circuit boards in said second and third planes include light sources and said cover includes optical fibers adapted to extend into said housing and thereby optically contact said light sources.

11. The apparatus according to claim 10 wherein said light sources are light emitting diodes.

12. The apparatus of claim 1, wherein said printed circuit boards in said first plane are of different dimensions.

\* \* \* \* \*